United States Patent
Kim

(10) Patent No.: US 6,955,998 B2
(45) Date of Patent: Oct. 18, 2005

(54) METHOD FOR FORMING LOW DIELECTRIC LAYER OF SEMICONDUCTOR DEVICE

(75) Inventor: Tae Kyung Kim, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/744,530

(22) Filed: Dec. 22, 2003

(65) Prior Publication Data
US 2004/0253388 A1    Dec. 16, 2004

(30) Foreign Application Priority Data
Jun. 16, 2003  (KR) .................... 10-2003-0038743

(51) Int. Cl.[7] ............................................ H01L 21/469
(52) U.S. Cl. ..................................... 438/781; 257/642
(58) Field of Search ........ 257/642–644; 438/710–712, 438/780, 781, 789, 790, 795, 913

(56) References Cited

U.S. PATENT DOCUMENTS

| | | | |
|---|---|---|---|
| 5,177,162 A | * | 1/1993 | Matsuura et al. ............. 526/70 |
| 5,226,967 A | | 7/1993 | Chen et al. |
| 5,368,710 A | | 11/1994 | Chen et al. |
| 5,501,880 A | * | 3/1996 | Parker et al. ............ 427/389.9 |
| 6,083,572 A | | 7/2000 | Theil et al. |
| 6,528,432 B1 | * | 3/2003 | Ngo et al. .................. 438/780 |
| 2003/0104185 A1 | * | 6/2003 | Dittrich et al. ............. 428/209 |

* cited by examiner

Primary Examiner—David Nelms
Assistant Examiner—Calvin Lee
(74) Attorney, Agent, or Firm—Ladas & Parry LLP

(57) ABSTRACT

Disclosed is a method for forming a low dielectric layer of a semiconductor device. The method includes the steps of forming a low dielectric polymer layer on a semiconductor substrate and performing an in-situ plasma-assistant surface modification process with respect to the low dielectric polymer layer, thereby forming an adhesion promoter layer on the low dielectric polymer layer. The method prevents a film from being delaminated at an interfacial surface due to film stress or adhesion fault, after processes for forming the low dielectric layer and a low resistance metal wiring have been completed to achieve semiconductor devices operated at a high speed.

9 Claims, 4 Drawing Sheets

METHOD FOR FORMING LOW DIELECTRIC LAYER OF SEMICONDUCTOR DEVICE

BACKGROUND OF THE INVENTION

1. Field of the Invention

The present invention relates to a method for forming a low dielectric layer of a semiconductor device, and more particularly to a method for forming a low dielectric layer of a semiconductor device capable of preventing a film from being delaminated at an interfacial surface due to film stress or adhesion fault, after processes for forming a low dielectric layer and a low resistance metal wiring have been completed to achieve semiconductor devices operated at a high speed.

2. Description of the Prior Art

As semiconductor devices have been highly integrated, characteristic resistance of a semiconductor device caused by an RC time delay and signal interference becomes an issue. For this reason, an integration technique for lower dielectric layers and low resistance metal wirings has been studied and developed.

Recently, as a low dielectric layer formed by using polymer material has been developed, an integrating process for the lower dielectric layer with a metal wiring, such as W, Al or Cu, has been actively studied.

The low dielectric polymer layer includes a carbon-hydrogen compound and oxygen added to the carbon-hydrogen compound.

However, the low dielectric polymer layer is formed with a porous structure and has hardness lower than hardness of an oxide layer, so adhesion force of the low dielectric polymer layer is lowered when stress is applied thereto.

For this reason, as shown in FIG. 1, a next process, such as a process for forming a SiON layer 15 used for a hard mask, a metal diffusion barrier 17 and a tungsten layer 19, has been carried out after forming the low dielectric polymer layer, or when a reliability testing process is carried out after semiconductor fabricating processes have been carried out as shown in FIG. 2, a succeeding insulation layer is delaminated from the low dielectric polymer layer.

Such delamination of the insulation layer is derived from a lack of adhesion force at an interfacial surface between insulation layers and causes a decrease of a yield rate of semiconductor devices.

SUMMARY OF THE INVENTION

Accordingly, the present invention has been made to solve the above-mentioned problems occurring in the prior art, and an object of the present invention is to provide a method for forming a low dielectric layer of a semiconductor device, in which an in-situ plasma-assistant surface modification process is carried out, thereby solving a delamination problem of an insulation layer at an interfacial surface between insulation layers when insulation layer forming processes are sequentially carried out or a reliability test is carried out.

In order to accomplish this object, there is provided a method for forming a low dielectric layer of a semiconductor device, the method comprising the steps of: forming a low dielectric polymer layer on a semiconductor substrate; and performing an in-situ plasma-assistant surface modification process with respect to the low dielectric polymer layer, thereby forming an adhesion promoter layer on the low dielectric polymer layer.

BRIEF DESCRIPTION OF THE DRAWINGS

The above and other objects, features and advantages of the present invention will be more apparent from the following detailed description taken in conjunction with the accompanying drawings, in which:

FIGS. 4 and 5 are graphs showing an adhesion degree of a hard mask with respect to a low dielectric polymer layer as a function of a flow rate of gas and a sort of gas while forming the low dielectric layer of a semiconductor device according to one embodiment of the present invention, in which FIG. 4a represents the adhesion degree of the hard mask according to flow rate of $SiH_4$, and FIG. 4b represents the adhesion degree of the hard mask according to a plasma source.

DETAILED DESCRIPTION OF THE PREFERRED EMBODIMENTS

Figure 1:
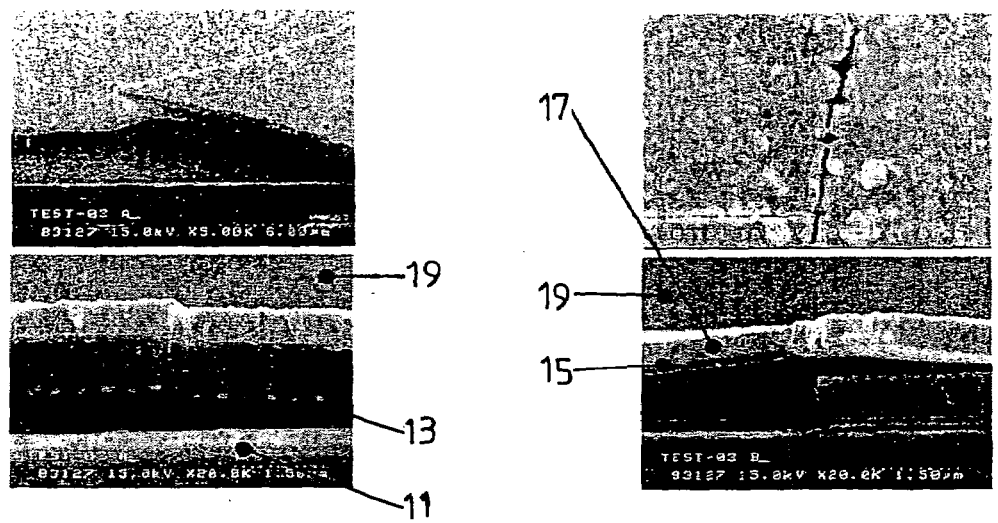
FIG. 1 is an SEM photograph showing a delamination of an insulation layer at an interfacial surface after an insulation layer has been formed on a low dielectric polymer Layer.
Figure 2:
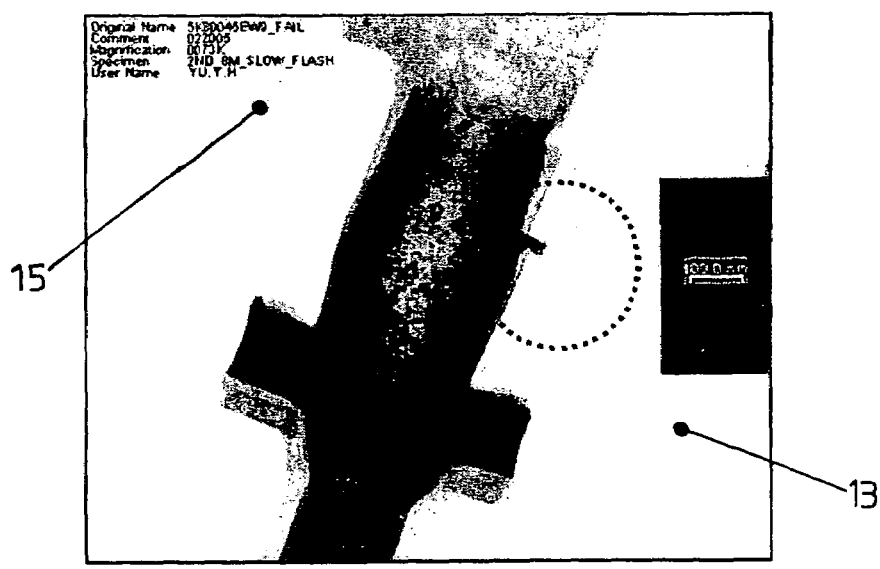
FIG. 2 is an SEM photograph showing a delamination of an insulation layer from a low dielectric polymer layer while a reliability test is being carried out.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3A:
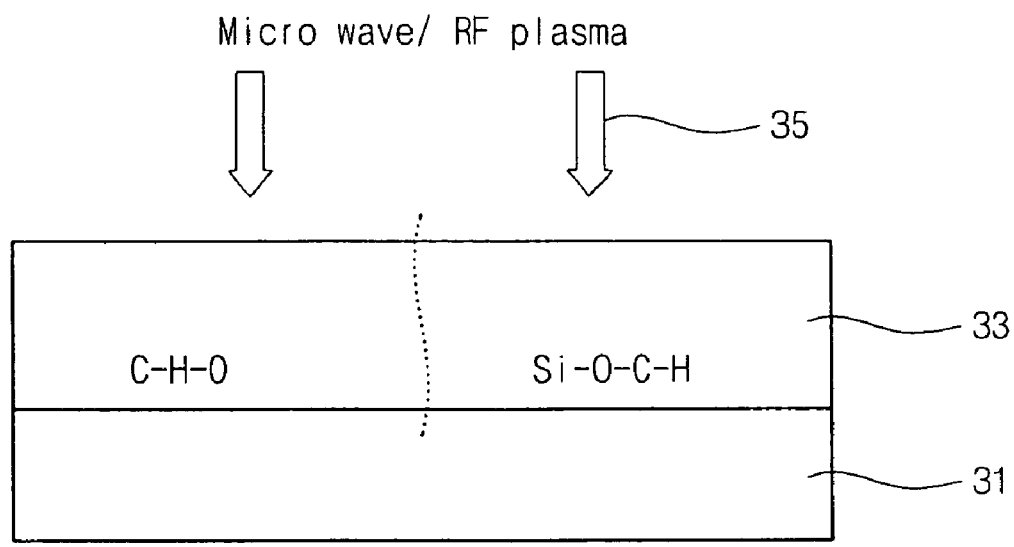
FIGS. 3a and 3b are sectional views of a semiconductor device, in which an in-situ plasma-assistant surface modification process is carried out in order to form a low dielectric layer of the semiconductor device according to one embodiment of the present invention.
Figure 3B:
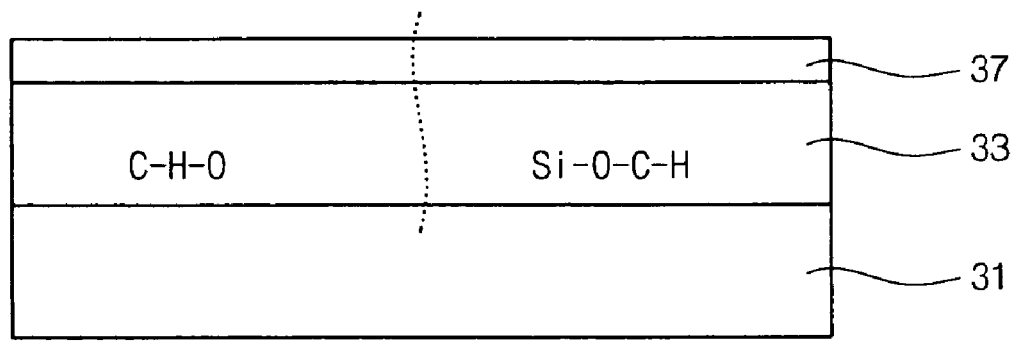

FIGS. 3a and 3b are sectional views of a semiconductor device, in which an in-situ plasma-assistant surface modification process is carried out in order to form a low dielectric layer of the semiconductor device according to one embodiment of the present invention.

Figure 4:
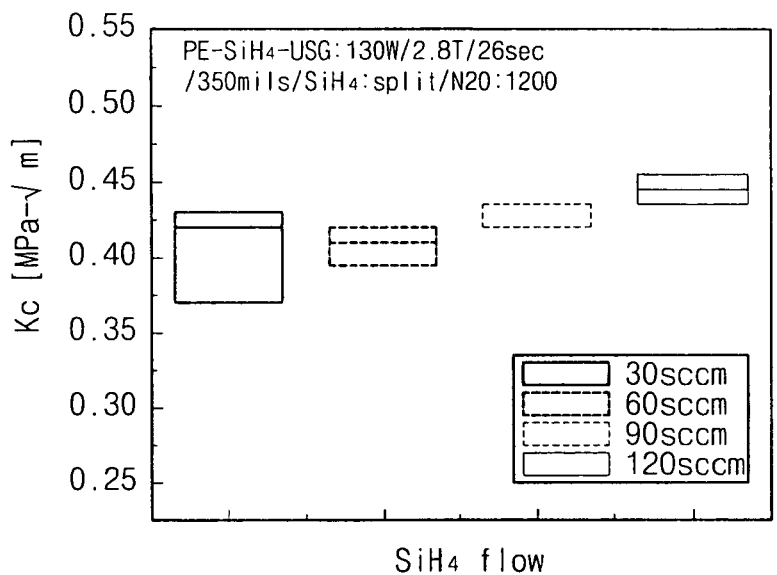
Figure 5:
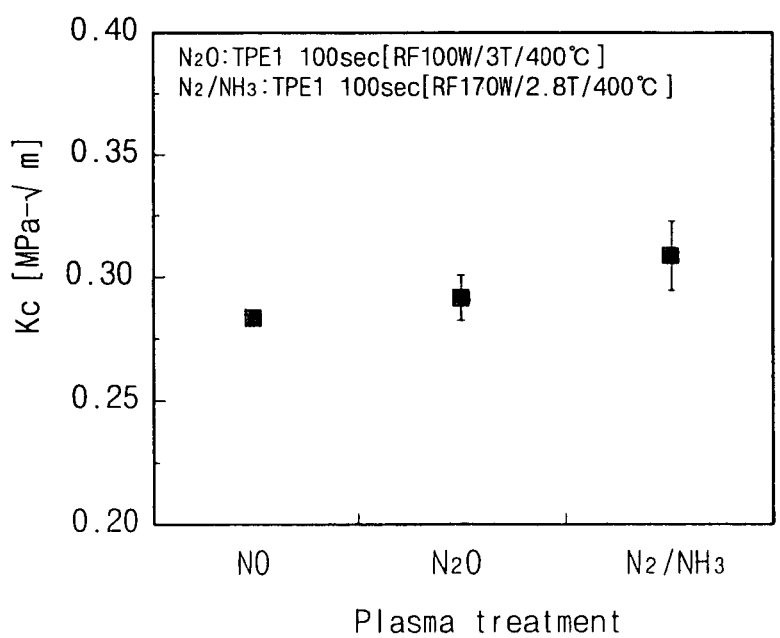

FIGS. 4 and 5 are graphs showing an adhesion degree of a hard mask with respect to a low dielectric polymer layer as a function of a flow rate of gas and a sort of gas while forming the low dielectric layer of a semiconductor device according to one embodiment of the present invention. FIG. 4 represents the adhesion degree of the hard mask according to flow rate of $SiH_4$, and FIG. 5 represents the adhesion degree of the hard mask according to a plasma source gas.

Figure 6:
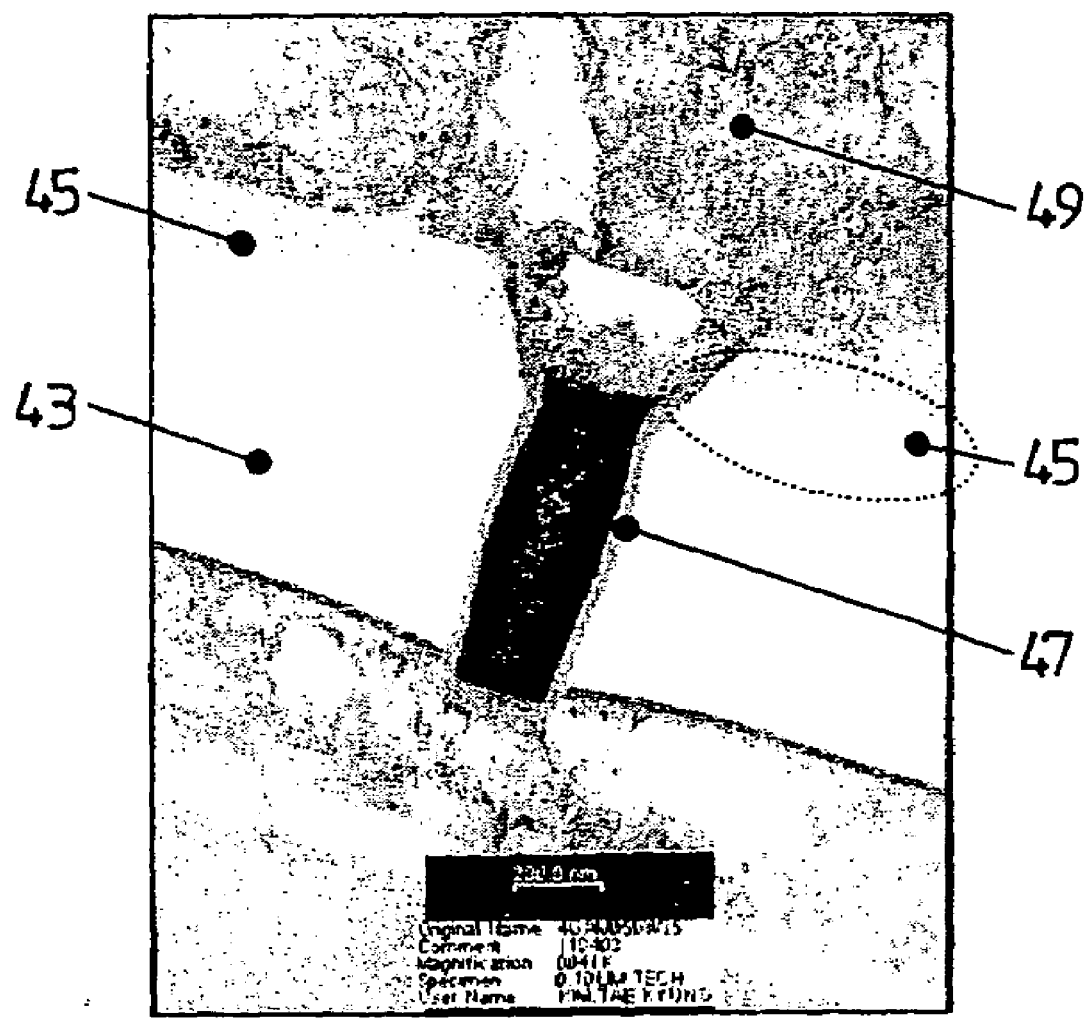
FIG. 6 is an SEM photograph, in which a process for forming an upper metal wiring has been completed by utilizing a low dielectric polymer layer according to one embodiment of the present invention as an interlayer.

FIG. 6 is an SEM photograph, in which a process for forming an upper metal wiring has been completed by utilizing a low dielectric polymer layer according to one embodiment of the present invention as an interlayer.

According to the method for forming the low dielectric layer of the semiconductor device of the present invention, as shown in FIG. 3a, a low dielectric polymer layer 33 is formed on a semiconductor substrate 31.

Then, as shown in FIG. 3b, in order to prevent a film from being delaminated at an interfaclal surface, an in-situ plasma-assistant surface modification process 35 is carried out with respect to an upper surface of the low dielectric polymer layer 33 in same equipment before a next process is performed. The process conditions for the in-situ plasma-assistant surface modification process are as follows.

First of all, microwave or RF plasma is mainly used among CCP (capacitively coupled plasma), ICP (inductively coupled plasma), and WHP (wave heated plasma).

In addition, $SiH_4$—$N_2O$ or $N_2$—$NH_3$ is used as plasma gas, and a process temperature is maintained in a range about 300 to 450° C. A flow rate of $SiH_4$ is about 30 to 120 sccm, a flow rate of $N_2O$ is about 1000 to 1200 sccm, a flow rate of $N_2$ is about 100 to 200 sccm, and a flow rate of $NH_3$ is about 300 to 600 sccm. In addition, HF is in a range about 0.1 to 1.0 KW, and LF is in a range about 0.1 to 2.0 KW.

$SiH_4$—$N_2O$ or $N_2$—$NH_3$ is also used as main gas for the in-situ plasma-assistant surface modification process. In addition, remote or plasma excited through microwave or RF is used. When the in-situ plasma-assistant surface modification process is carried out in same equipment performing the next process (for example, an oxide layer deposition process for a hard mask in CVD equipment or a metal barrier deposition process for a metal wiring in sputter equipment) before the next process is carried out, plasma processing equipment is not required and a process time can be shortened.

$SiH_4$—$N_2O$ plasma or $N_2$—$NH_3$ plasma modifies a surface of polymer while forming a thin adhesion promoter layer 37 on the low dielectric polymer layer 33. At this time, the thin adhesion promoter layer 37 has a C—H—N bonding structure or a Si—O—N bonding structure by partially modifying the surface of polymer having a bonding structure of C—H—O or Si—O—C—H. If silicon oxide or silicon oxynitride is used as a following insulation layer, the thin adhesion promoter layer 37 may improve adhesion force because the thin adhesion promoter layer 37 has a bonding structure similar to that of silicon oxide or silicon oxynitride. In addition, the thin adhesion promoter layer 37 blocks an out-gassing of organic substance or moisture contained in the low dielectric polymer layer 33, so adhesion force at the interfacial surface cannot be lowered when a following process is carried out, thereby preventing the film from being delaminated at the interfacial surface.

In addition, even if materials having great film stress, such as Tin and W, are deposited in the following process, the thin adhesion promoter layer 37 acts as a stress buffer, so a lifting phenomenon caused by film stress can be prevented.

FIGS. 4 and 5 are graphs showing an adhesion degree of a hard mask with respect to the low dielectric polymer layer as a function of a flow rate of gas and a sort of gas while forming the low dielectric layer of the semiconductor device according to one embodiment of the present invention. FIG. 4 represents the adhesion degree of the hard mask according to flow rate of $SiH_4$, and FIG. 5 represents the adhesion degree of the hard mask according to a plasma source.

As shown in FIGS. 4 and 5, the adhesion degree of the hard mask is improved as flow rate of $SiH_4$ increases. In addition, when $N_2$—$NH_3$ gas is used as a plasma source, the adhesion degree of the hard mask is improved.

Particularly, when silicon oxide is used as the low dielectric polymer layer, an out-gassing may occur when performing the next process because silicon oxide has higher hygroscopic property and includes great amount of organic substance therein. For this reason, the in-situ plasma-assistant surface modification process is carried out by adding to increasing gas containing N, such as $N_2O$, $N_2$ and $NH_3$, thereby preventing the out-gassing.

In addition, when the in-situ plasma-assistant surface modification process is carried out by utilizing gas containing N, such as $N_2O$, $N_2$ and $NH_3$, $SiO_x$ is reacted with N so that SiON compound having a densely packed membrane may be achieved.

On the other hand, FIG. 6 shows an SEM photograph, in which an upper metal wiring 49 has been formed after forming a low dielectric polymer layer 43, a SiON layer 45 used for a hard mask, and a tungsten plug 47 by utilizing the low dielectric polymer layer 43 according to one embodiment of the present invention as an interlayer.

As shown in FIG. 6, the delamination of a film does not occur at the interfacial surface due to the in-situ plasma-assistant surface modification process. That is, superior adhesion force is ensured at the interfacial surface.

As described above, according to a method for forming a low dielectric layer of a semiconductor device, the low dielectric layer has a porous structure and hardness lower than hardness of an oxide layer. Thus, the low dielectric layer may be delaminated from an insulation layer formed on the low dielectric layer through a following process when film stress occurs. For this reason, the in-situ plasma-assistant surface modification process is carried out with respect to the low dielectric layer, thereby improving adhesion force between the low dielectric layer and the succeeding insulation layer or a metal wiring layer, thereby preventing the film from being delaminated at the interfacial surface while a reliability test is being carried out even if the reliability test is carried out under an inferior condition.

Therefore, it is possible to increase a yield rate of the semiconductor device and to ensure reliability of the semiconductor device by removing factors causing the fault of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a low dielectric layer of a semiconductor device, the method comprising the steps of:
   i) forming a low dielectric polymer layer on a semiconductor substrate;
   ii) performing an in-situ plasma-assistant surface modification process with respect to the low dielectric polymer layer, wherein an adhesion promoter layer having a bonding structure of S—H—N or Si—O—N is formed on the low dielectric polymer layer through the in-situ plasma-assistant surface modification process.

2. The method as claimed in claim 1, wherein the low dielectric polymer layer includes material having a C—H—O bonding structure or Si—O—C—H bonding structure.

3. The method as claimed in claim 1, wherein $SiH_4$—$N_2O$ gas or $N_2$—$NH_3$ gas is used as plasma gas when the in-situ plasma-assistant surface modification process is carried out.

4. The method as claimed in claim 3, wherein the adhesion promoter layer formed by reacting $SiH_4$, $N_2O$, $N_2$ and $NH_3$ gases in a plasma state with the surface of the low dielectric polymer having a bonding structure of C—H—O or Si—O—C—H.

5. The method as claimed in claim 1, wherein remote or direction plasma excited through microwave or RF is used when performing the in-situ plasma-assistant surface modification process.

6. The method as claimed in claim 1, wherein $SiH_4$—$N_2O$ gas or $N_2$—$NH_3$ gas is used as plasma gas and a process temperature is maintained in a range about 300 to 450° C. when performing the in-situ plasma-assistant surface modification process.

7. The method as claimed in claim 1, wherein, when the in-situ plasma-assistant surface modification process is carried out, a flow rate of $SiH_4$ is about 30 to 120 sccm, a flow rate of $N_2O$ is about 1000 to 1200 sccm, a flow rate of $N_2$ is about 100 to 200 sccm, a flow rate of $NH_3$ is about 300 to 600 sccm, HF is in a range about 0.1 to 1.0 KW, and LF is in a range about 0.1 to 2.0 KW.

8. The method as claimed in claim 1, wherein the low dielectric polymer layer includes silicon oxide.

9. The method as claimed in claim 1, wherein the low dielectric polymer layer is used as an interlayer or a passivation layer.

* * * * *